United States Patent

Wang

[11] Patent Number: 5,548,248
[45] Date of Patent: Aug. 20, 1996

[54] RF AMPLIFIER CIRCUIT

[76] Inventor: Nan L. L. Wang, 1445 6th St., Alameda, Calif. 94501

[21] Appl. No.: 497,070

[22] Filed: Jul. 30, 1995

[51] Int. Cl.⁶ .................................................. H03F 3/19
[52] U.S. Cl. ........................ 330/288; 330/290; 330/302
[58] Field of Search .................................... 330/288, 290, 330/302, 306, 311; 323/315, 316

[56] References Cited

U.S. PATENT DOCUMENTS

| | | | |
|---|---|---|---|
| 4,105,944 | 8/1978 | Anderson | 330/290 |
| 4,311,967 | 1/1982 | Schade | 330/288 |
| 4,532,477 | 7/1985 | Green, Jr. et al. | 330/149 |
| 4,841,253 | 6/1989 | Crabill | 330/277 |
| 4,855,614 | 8/1989 | Maitre | 307/241 |
| 4,881,046 | 11/1989 | Tung | 330/277 |
| 4,956,615 | 9/1990 | Bohme et al. | 330/288 |
| 5,021,743 | 6/1991 | Chu et al. | 330/54 |
| 5,136,257 | 8/1992 | Reading | 330/129 |
| 5,150,076 | 9/1992 | Asazawa | 330/296 |
| 5,162,755 | 11/1992 | Mara, Jr. et al. | 330/277 |
| 5,281,925 | 1/1994 | Hulick | 330/296 |
| 5,298,869 | 3/1994 | Jinich et al. | 330/286 |
| 5,374,899 | 12/1994 | Griffiths et al. | 330/277 |

Primary Examiner—Steven Mottola
Attorney, Agent, or Firm—Loyal M. Hanson

[57] ABSTRACT

A radio frequency (RF) amplifier circuit having an input terminal, an output terminal, a power supply terminal, and a control node, includes first, second, and third transistors interconnected in a modified current source or current mirror configuration with first, second, and third resistors and a matching circuit to produce a desired bias current according to the magnitude of a control voltage coupled to the control node while producing an amplified output radio frequency signal at the output terminal from an input radio frequency signal coupled to the input terminal. Implemented with bipolar transistors, enhancement mode field effect transistors, or depletion mode field effect transistors, the circuit achieves two-stage amplification with simplified interstage coupling and therefore fewer components and less size and cost.

15 Claims, 3 Drawing Sheets

RF AMPLIFIER CIRCUIT

BACKGROUND OF THE INVENTION

1. Technical Field

This invention relates generally to electronic circuits, and more particularly to a semiconductor circuit achieving greater gain with fewer components for amplifying radio frequency (RF) signals at frequencies over 300 megahertz (MHz).

2. Description of Related Art

A semiconductor circuit designer creating an RF power amplifier circuit seeks high performance in a small package. Recent developments of GaAlAs/GaAs heterojunction bipolar transistors (HBTs) contribute by providing semiconductor devices having better high frequency performance. But existing RF amplifier circuits frustrate the effort by requiring too many supporting components.

Consider the task of designing a 2-stage, 1.4 watt, RF amplifier for a cellular telephone operating in the 800-MHz band. Known design techniques couple an external dc-bias circuit to each stage of the RF circuit through an isolating RF choke. In addition, they use reactive matching for interstage RF coupling as well as input and output RF coupling. The problem is that all the components required to do that make the RF amplifier large in size (e.g., 1.6 cm by 1.0 cm) and difficult to implement in a small integrated circuit (IC) package. Thus, designers need an RF amplifier circuit alleviating that concern.

SUMMARY OF THE INVENTION

This invention solves the problem outlined above by providing a semiconductor circuit that sets its own direct current (DC) bias while providing 2-stage RF amplification. The circuit may be thought of as a derivative of the well-known, 3-transistor, current source design, with proper component values setting a desired quiescent operation point. But unlike a simple 3-transistor current source, the circuit of this invention includes a couple additional resistors that take advantage of the transistors RF characteristics to simultaneously achieve two stages of RF amplification.

Thus, the invention eliminates the external dc-bias circuit. It simplifies interstage coupling. It enables implementation in a smaller package. And it may use bipolar transistors or either enhancement mode or depletion mode field effect transistors (FETs).

In terms of some of the claim language, an RF amplifier circuit constructed according to the invention has an input terminal, an output terminal, a power supply terminal, and a control node. The amplifier circuit includes means in the form of first, second, and third transistors interconnected in a modified current source configuration with first, second, and third resistors and a matching circuit. Those components are interconnected to produce a desired bias current according to the magnitude of a control voltage coupled to the control node while producing an amplified output radio frequency signal at the output terminal from an input radio frequency signal coupled to the input terminal.

One embodiment is implemented using bipolar transistors. The first transistor has its collector connected to a first common node, its base connected to a second common node, and its emitter connected to a common ground. The second transistor has its base connected to the first common node and its collector connected to the power supply terminal. The third transistor has its base connected to the second common node and its emitter connected to the common ground. The first resistor is connected between the first common node and the control node, the second resistor is connected between the emitter of the second transistor and the second common node, and the third resistor is connected between the second common node and the common ground. The matching circuit includes means in the form of circuit elements connected to the collector of the third transistor, the power supply terminal, and the output terminal for presenting a desired impedance between the collector of the third transistor and the power supply terminal while matching that impedance to the impedance of a load connected to the output terminal.

Configured that way using bipolar transistors, enhancement mode FETs, or depletion mode FETs, the circuit achieves two-stage amplification with simplified interstage coupling and therefore fewer components and less size and cost. The following illustrative drawings and detailed description make the foregoing and other objects, features, and advantages of the invention more apparent.

DESCRIPTION OF THE PREFERRED EMBODIMENTS

Prior Art RF Amplifier Circuit. A brief review of the prior art circuits in FIGS. 1 and 2 helps describe the invention. First, consider the prior art circuit shown in FIG. 1. It is a two-stage RF amplifier circuit for frequencies above 300 MHz. Additional stages may be added for more gain, and it may be used, for example, in the transmitter section of existing cellular telephone equipment. Typical gain is 24 dB with 31 dBm output power in the 800 to 900-Mhz range.

Figure 1:
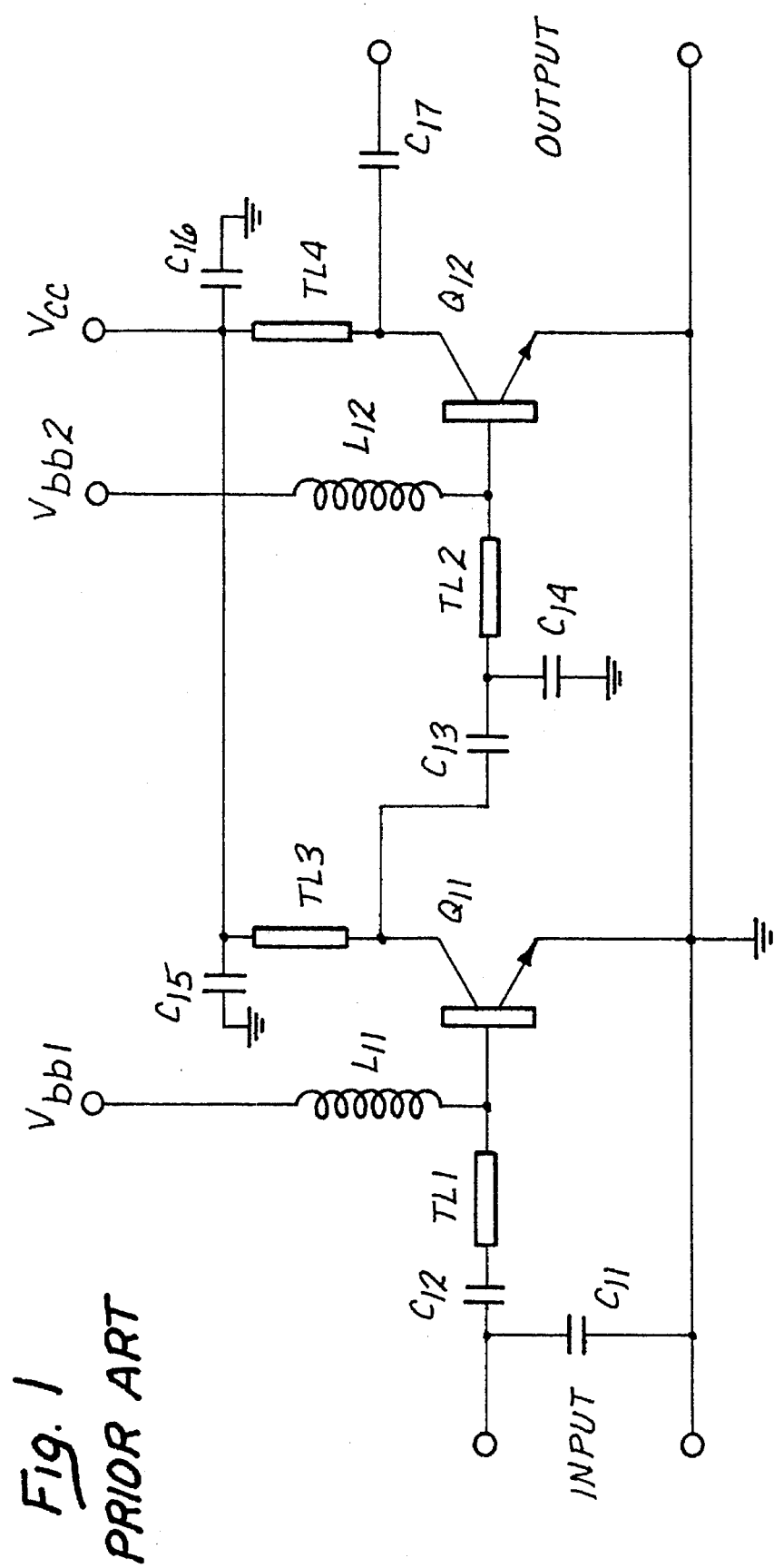
FIG. 1 of the drawings is an existing RF amplifier circuit constructed according to the prior art with an external bias supply and reactive interstage coupling.
Figure 2:
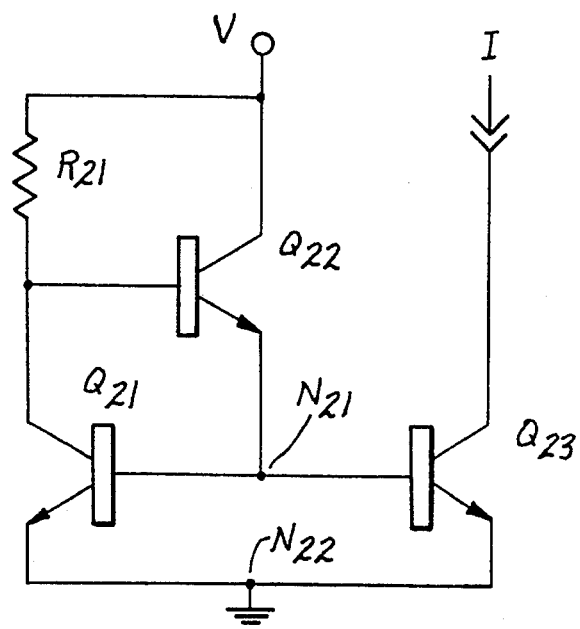
FIG. 2 is a well known current source configuration according to the prior art.

The prior art RF amplifier in FIG. 1 includes reactive matching for maximum gain. It uses capacitors and inductors for matching, and no resistors. External dc-bias circuits must be connected at $V_{bb1}$ and $V_{bb2}$. Input and output impedances are typically 50 ohms.

$C_{15}$ and $C_{16}$ are RF bypassing capacitors. They present an effective RF short circuit, allowing DC to the collectors of $Q_{11}$ and $Q_{12}$ (the drains in circuits using FETs) to be brought in from $V_{cc}$ through transmission lines TL3 and TL4. $L_{11}$ and $L_{12}$ (which can be implemented by transmission lines) are RF chokes used to set the DC bias voltage for the bases of $Q_{11}$ and $Q_{12}$ (the gates in circuits using FETs).

A bias circuit which generates $V_{bb1}$ and $V_{bb2}$ can be included in the amplifier module of which the circuit in FIG. 1 is a part. The RF chokes $L_{11}$ and $L_{22}$ connect the bias circuit's DC signal to the RF amplifier and prevent RF signal from entering the bias circuit.

The amplifier circuit in FIG. 1 uses bipolar transistors, but similar RF amplifier circuits sometimes use enhancement mode or depletion mode FETs. $V_{bb1}$ and $V_{bb2}$ ($V_{gg1}$ and $V_{gg2}$ in circuits using FETs) are positive for bipolar transistors. $V_{gg1}$ and $V_{gg2}$ will be positive for enhancement mode FETs and negative for depletion mode FETs.

Typically, the prior art amplifier circuit in FIG. 1 is implemented as a hybrid circuit on a ceramic substrate (e.g., alumina) or on a printed circuit board (e.g., the commonly used printed circuit board called FR4). All the components (capacitors and resistors) are discrete components, typically surface mounted devices. Inductors are implemented by forming microstrip transmission lines TL1 through TL4 on the substrate.

The basic circuit design shown in FIG. 1 is often elaborated upon according to meet various specifications, but the physical construction is generally as described above. Inasmuch as transistor performance varies from batch to batch, the voltages $V_{bb1}$ and $V_{bb2}$ must be adjusted accordingly to provide the necessary bias condition. This adjustment for every batch is a drawback affecting mass production.

For the prior art two-stage RF amplifier circuit in FIG. 1, quite a few components are needed, including the microstrip transmission lines for the inductors. Therefore, the area required by the circuit is difficult to reduce. A typical prior art circuit such as that shown in FIG. 1 may occupy a footprint of about 16 mm by about 11 mm.

Prior Art Current Source Circuit. Next, consider the prior art circuit in FIG. 2. It is a current source implemented with bipolar transistors. It is a well known textbook circuit and it is also commonly referred to as a current mirror.

Operation is well known. $Q_{21}$ and Q23 have their bases connected together at a common node $N_{21}$ and their emmitters tied together at a common node $N_{22}$. Since $Q_{21}$ and $Q_{23}$ share the same voltage Vbe from base to emitter, the collector current through each one of $Q_{21}$ and $Q_{23}$ is proportional to the transistor size. In other words, the current through $Q_{23}$ mirrors the current through $Q_{21}$.

The base currents of $Q_{21}$ and $Q_{23}$ are provided by the transistor $Q_{22}$. The resistor $R_{21}$ carries the collector current of $Q_{21}$ and the base current of $Q_{22}$. With the typical current gain of the bipolar transistor, the $Q_{22}$ base current is a small fraction of the $Q_{21}$ collector current.

Since the base of $Q_{22}$ is at a potential of 2 $V_{be}$, and the current through the resistor $R_{21}$ is primarily the $Q_{21}$ collector current, the $Q_{21}$ collector current can be said to vary directly with the voltage V. As a result, the current I through $Q_{23}$ varies with the voltage V also, and its value is dependent on the relative size of the transistors $Q_{21}$ and $Q_{23}$. For the case in which $Q_{21}$ and $Q_{23}$ have identical characteristics, the $Q_{23}$ collector current I equals the $Q_{21}$ collector current. In many practical circuits, however, $Q_{23}$ is usually much larger than $Q_{21}$.

This type of current source circuit can be implemented with FETs as well. Many variations and derivatives exist. The current I can be used as a current source for other circuitry, or $Q_{23}$ can be part of circuitry operating at the quiescent bias current of I. In the latter case, an inductor usually is added between the base of $Q_{23}$ and the node $N_{21}$. Such an inductor (not shown) does not affect direct current operation, but it isolates $Q_{21}$ and $Q_{22}$ from any alternating current (AC) signal in $Q_{23}$.

Figure 3:
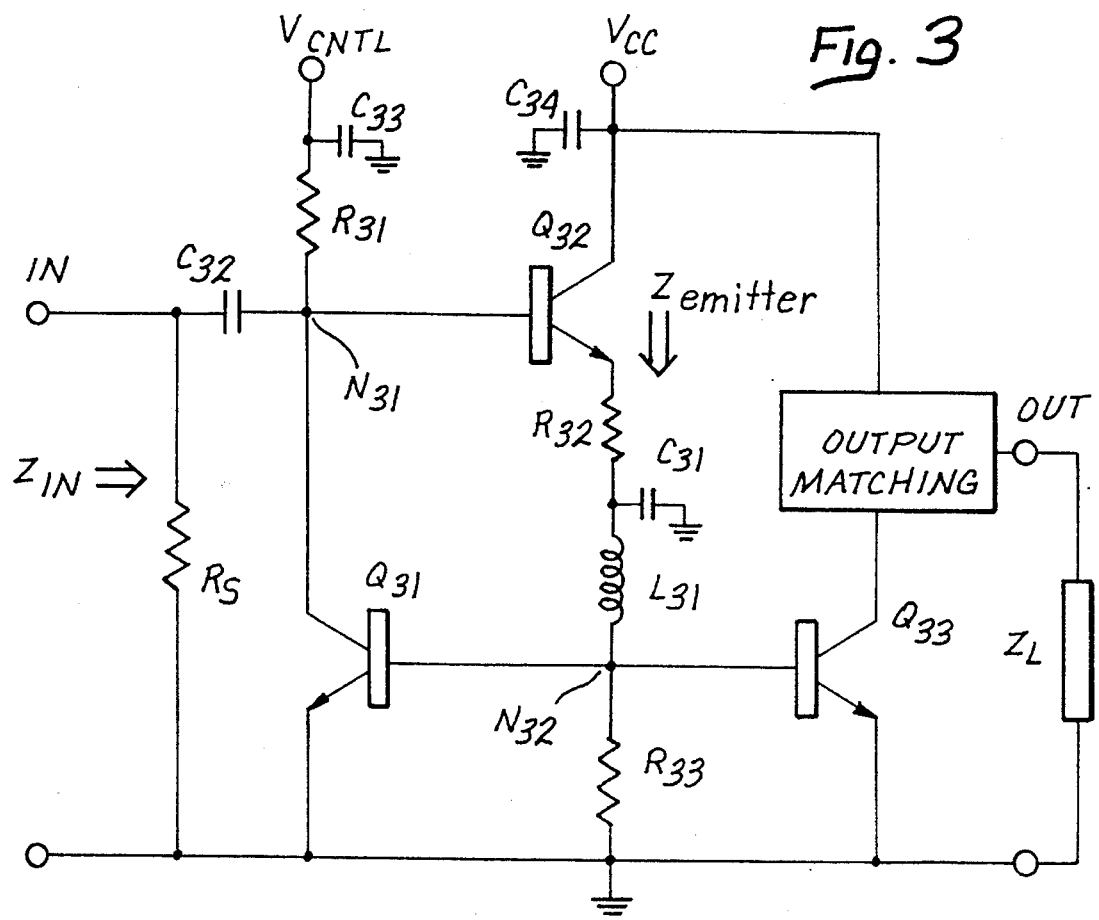
FIG. 3 is a schematic circuit diagram of a first RF amplifier circuit constructed in a modified current source configuration according to the invention, illustrated with circuit symbols for bipolar transistors although enhancement mode FETs may be substituted.

The Circuits of this Invention. Now consider an RF amplifier constructed according to the invention as shown in FIG. 3. It includes three transistors $Q_{31}$, $Q_{32}$, and $Q_{33}$ interconnected much like the transistors in the current source in FIG. 2, except for the addition of resistors $R_{32}$ and $R_{33}$ (and possibly $L_{31}$ and $C_{31}$) and the use of $V_{CNTL}$ separate from $V_{cc}$. The addition of $R_{32}$, $L_{31}$, and $C_{31}$ enables RF amplification without affecting the DC bias operation principle, causing $Q_{32}$ to function for RF amplification purposes as an emitter follower or common collector stage, followed by $Q_{33}$ as a common emitter stage. $R_{33}$ adjusts the total emitter current from $Q_{32}$ to avoid waveform clipping for class A or class AB operation, and use of a separate $V_{CNTL}$ enables fine tuning of the quiescent operating point. $C_{33}$ presents a RF short that prevents the RF signal from leaking to $V_{CNTL}$. $C_{34}$ serves the same function for $V_{cc}$ Since the transistor $Q_{31}$ is much smaller than the transistor $Q_{33}$, the $Q_{31}$ base current $I_{b31}$ is much smaller than the $Q_{33}$ base current $I_{b33}$. Therefore, the $Q_{32}$ emitter current $I_{e32}$ is approximately equal to the sum of the $Q_{33}$ base current $I_{b33}$ and the current through the resistor $R_{33}$. $I_{e32}$, even in large signal operation, is always positive (flowing out of $Q_{32}$ emitter in FIG. 3). That relationship can be expressed in terms of the $Q_{33}$ base-to-emitter voltage $V_{be33}$.

$$I_{e32}=I_{b33}+V_{be33}/R_{33}$$

In the simplest RF operation (i.e., no $R_{32}$, $L_{31}$, and $C_{31}$), the swing of the $Q_{33}$ collector-to-base voltage $V_{cb}$ combined with the $Q_{33}$ collector-to-base capacitance $C_{cb}$ cause an extra current component in the base current $I_{b33}$ flowing from the node $N_{32}$ to the transistor $Q_{33}$. That component may be expressed as $j\omega C_{cb}V_{cb}$, and the total current $I_{b33}$ flowing to the transistor $Q_{33}$ from the node $N_{32}$ can therefore be expressed approximately as the sum of that component and the $Q_{33}$ quiescent base current $I_{b33q}$.

$$I_{b33}=j\omega C_{cb}V_{cb}+I_{b33q}$$

In large signal operation without the resistor $R_{33}$, the peak magnitude of the $j\omega C_{cb}V_{cb}$ component can exceed the quiescent base current $I_{b33q}$ Of the transistor $Q_{33}$, which means $I_{b33}$ sometimes is negative. Since $I_{e32}$ equals $I_{b33}$ when $R_{33}$ is not used and $I_{e32}$ is greater than zero at all times, $Q_{32}$ cannot support the sine-wave reactive current $j\omega C_{cb}V_{cb}$ (with waveform clipping resulting). However, the resistor $R_{33}$ increases the quiescent current $I_{e32Q}$ supplied by the transistor $Q_{32}$ to overcome that concern. The value of the resistor $R_{33}$ is chosen so that the extra current, $V_{be33}/R_{33}$, is about the same as the peak magnitude of $I_{b33}$, allowing $I_{e32}$ to be greater than zero all the time and that arrangement overcomes waveform clipping concerns, which is essential in class A operation.

The input impedance, $Z_{IN}$, is approximately $\beta^*Z_{emitter}$ (FIG. 3), and is preferably designed to be greater than 50 ohms. With $C_{32}$ as a RF short circuit, and a shunt 50-ohm resistor $R_S$, the amplifier has a good input VSWR in the 50-ohm system. The $Z_{emitter}$ can be adjusted by $R_{32}$, $C_{31}$, and $L_{31}$. $C_{31}$ and $L_{31}$ form a simple impedance transformation to raise the $Z_{emitter}$ by the reactive matching approach and the RF gain is increased also. $R_{32}$ also can raise the $Z_{emitter}$, but with less RF gain. The two approaches can be used simultaneously or separately to adjust the overall RF gain of the amplifier to the desired value.

$V_{CNTL}$ can be replaced by $V_{cc}$. $R_{31}$ is adjusted to give the desired bias condition. Thus, only $V_{cc}$ is needed for the amplifier module. In an opposite situation, $V_{CNTL}$ can be adjusted to give different quiescent current for $Q_{33}$. Therefore, the bias condition of the amplifier can be easily changed from class A to class AB and to class B. This is most helpful in the dual mode application, such as the IS54 cellular standard, where the transmitter needs to be in class A for the digital mode of operation and in class B for the analog mode. The $V_{CNTI}$ can be provided by a digital-to-analog converter and be controlled by the baseband controller in the cellular phone.

Component values may vary significantly according to the precise application. One of ordinary skill in the related art may use known design techniques to determine and select the component values required. As a general idea of the componentry that can be used for a cellular telephone transmitter in the 800-MHz band, the following design steps are outlined using an GaAlAs/GaAs HBT. An amplifier using another type of bipolar/HBT is designed in much the same way.

First, for 4.7-volt operation, the output transistor $Q_{33}$ operation current is about 600 milliampere (mA) for class A design of a 1.4-watt amplifier. Therefore, $Q_{33}$ size can be chosen by this requirement. Note that in RF operation, $Q_{33}$ needs to support an instantaneous maximum current of 1200 mA for class A design.

Assuming the $C_{bc}$ of $Q_{33}$ is 3 picofarad (pF), and the $V_{cb}$ at 4.7-volt bias is 4 volts (V), $j\omega C_{cb} V_{cb}$ is about j60 mA. This is much greater than the quiescent base current, $I_{b33}=$ 600 mA/$\beta$=12 mA (assuming $\beta$=50). Therefore, $R_{33}$ is chosen to be 23.3 ohms ($V_{be33}$ =1.4 V and 1.4 V/60 mA equals 23.3 ohms, the value chosen for $R_{33}$).

$I_{e32}$=60 mA+12 mA+$I_{b31}$, or approximately 72 mA. So, $I_{32}$, which equals $I_{e32}/\beta$, is approximately 72 mA/50 or 1.4 mA. 3 mA is designed to flow through $R_{32}$. Therefore, $I_{c31}$=1.6 mA, and $Q_{31}$ can indeed be much smaller than $Q_{33}$. $Q_{32}$ needs to handle 72 mA of current, with a maximum current of 144 mA, and its size is determined accordingly.

Since the base of $Q_{31}$ is at 2.8 V, choose $V_{CNTL}$4 V. $R_{31}$ then equals (4 V–2.8 V)/3 mA=400 ohms.

$Z_{emitter}$ for HBT technology is about 7 ohms. Therefore, $Z_{IN}$ is the parallel combination of $R_{31}$ and $\beta_{32}*7$ ohms, or 350 ohms for $\beta$=50. $Z_{IN}$ is approximately 187 ohms, greater than 50 ohms.

With the above-derived values, a circuit designer can use a simulation tool (e.g., SPICE) to pin down other details of the design. If the RF gain needs to be adjusted, $L_{31}$ and $C_{31}$ can be used to raise the gain, or $R_{32}$ can be used to reduce the gain.

The foregoing design approach can be implemented on a single semiconductor die, except for the output matching circuit, and possibly $C_{31}$, $C_{32}$, $C_{33}$, $C_{34}$, $L_{31}$, and the shunt 50-ohm resistor $R_S$ at the input. Compared with existing amplifiers, the number of surface mount components is greatly reduced, and the physical size is also minimized. Compared to the circuit in FIG. 1 where three reactive matching circuits are used, the circuits of this invention can use only one reactive matching circuit at the output, allowing the amplifier physical size to be reduced to half, or even one-third. Therefore, this invention allows the amplifier to be built more easily, at a lower cost, and much smaller than the prior art.

In terms of some of the claim language, the amplifier has an input terminal (IN), an output terminal (OUT), a power supply terminal ($V_{cc}$), and a control node ($V_{CNTL}$). In broad terms, the circuit includes means in the form of first, second, and third transistors ($Q_{31}$, $Q_{32}$, and $Q_{33}$) interconnected in a modified current source (or current mirror) configuration with first, second, and third resistors ($R_{31}$, $R_{32}$, and $R_{33}$) and a matching circuit for producing a desired bias current (through $Q_{32}$ and $Q_{33}$) according to the magnitude of a control voltage coupled to the control node while producing an amplified output radio frequency signal at the output terminal from an input radio frequency signal coupled to the input terminal.

First transistor $Q_{31}$ has a collector connected to a first common node ($N_{31}$), a base connected to a second common node ($N_{32}$), and an emitter connected to a common ground. Second transistor $Q_{32}$ has a base connected to the first common node $N_{31}$ and a collector connected to the power supply terminal $V_{CC}$. Third transistor $Q_{33}$ has a base connected to the second common node $N_{32}$ and an emitter connected to the common ground.

The first resistor $R_{31}$ is connected between the first common node and the control node. The second resistor $R_{32}$ is connected between the emitter of the second transistor $Q_{32}$ and the second common node $N_{32}$. The third resistor $R_{33}$ is connected between the second common node $N_{32}$ and the common ground.

The matching circuit includes means (e.g., resistive and/or reactive components) connected to the collector of the third transistor $Q_{33}$, the power supply terminal, and the output terminal. It serves the function of presenting a desired impedance between the collector of the third transistor and the power supply terminal and matching that impedance to the impedance of a load connected to the output terminal. From the foregoing and subsequent descriptions, one of ordinary skill in the art can design a suitable output matching circuit using known componentry and design techniques.

The foregoing and subsequent descriptions also enable one of ordinary skill in the art to implement an amplifier according to the broader inventive concepts disclosed using enhancement mode FETs. They may be substituted for the three transistors illustrated in FIG. 3, and so FIG. 3 is intended to illustrate both bipolar transistor and enhancement mode FET embodiments.

Figure 4:
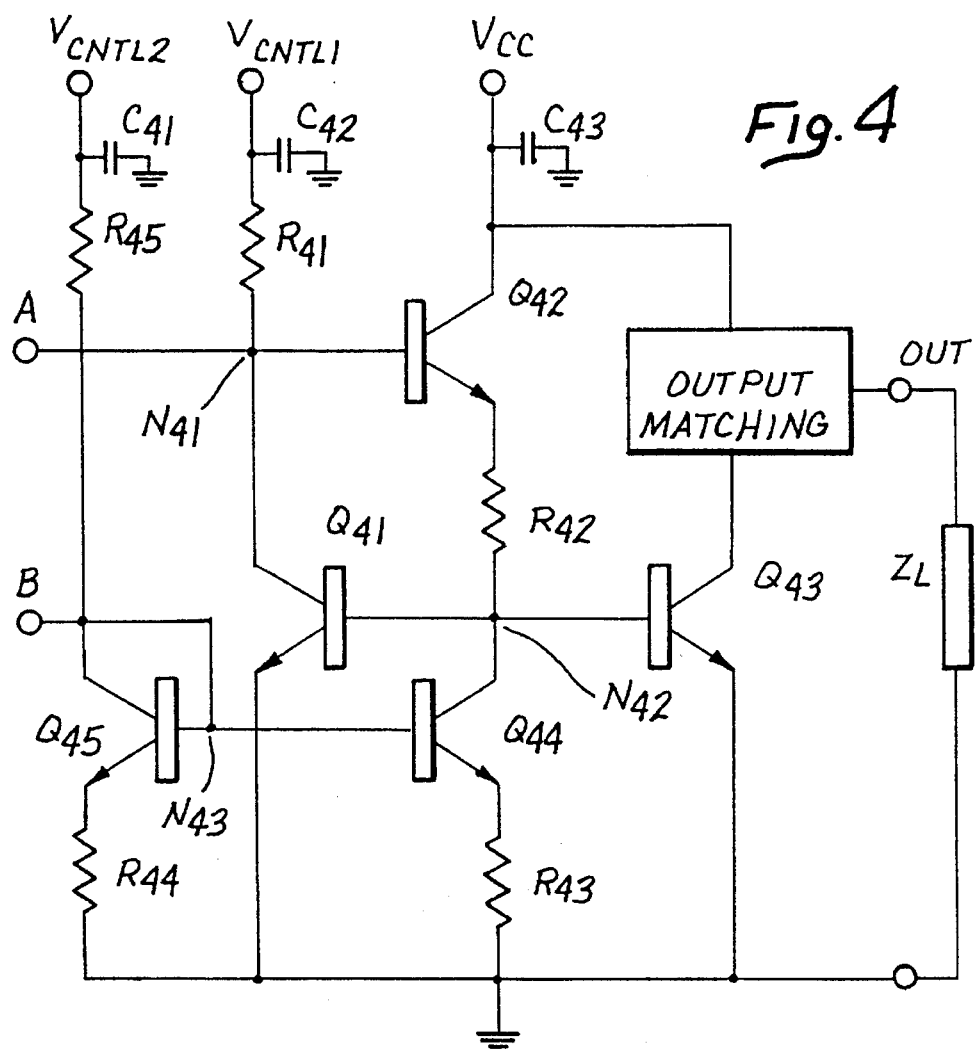
FIG. 4 is a schematic circuit diagram of a second RF amplifier constructed according to the invention that includes two additional transistors in an additional current source configuration for biasing purposes.

FIG. 4 illustrates another embodiment of an amplifier constructed according to the invention. It is similar in many respects to the amplifier in FIG. 3, and so only differences are described in further detail.

A primary difference is the use of an additional current source between the second common node $N_{42}$ and the common ground. The current source includes fourth and fifth transistors $Q_{44}$ and $Q_{45}$ and fourth and fifth resistors $R_{44}$ and $R_{45}$. The fourth transistor $Q_{44}$ has its collector connected to the second common node $N_{42}$, its emitter connected to the third resistor $R_{43}$, and its base connected to a third common node $N_{43}$. The fifth transistor $Q_{45}$ has its base connected to the third common node $N_{43}$, its emitter connected through a fourth resistor $R_{44}$ to the common ground, and its collector connected to the common node $N_{43}$ and through a fifth resistor $R_{45}$ to a second control node $V_{CNTL2}$ ($C_{41}$, $C_{42}$, and $C_{43}$ present RF shorts).

Connected that way, the additional current source serves the function served by $R_{33}$ in FIG. 3. It sets the bias. Therefore, the current mirror will draw the same amount of current as $V_{be33}/R_{33}$ in FIG. 3. The current source made of $Q_{44}$ and $Q_{45}$ is the most basic two-transistor current mirror. The advantage of using the additional current source in place of using just $R_{33}$ in FIG. 3 is apparent when the amplifier needs to operate in more than one class, such as used in the IS54 dual mode operation. The additional current source enables operation in a selected one of class A, class AB, or class B operation by setting $V_{CNTL2}$ appropriately.

For class A operation, $R_{33}$ in FIG. 3 is required to avoid waveform clipping. However, in class B operation, waveform clipping is needed, and $R_{33}$ is FIG. 3 is not needed. In order to operate in both class A and class B (or class AB) with the same circuit in the most efficient way, the current through $R_{33}$ must be different for each mode. This can be achieved by using the additional current source made of $Q_{44}$ and $Q_{45}$.

The class A operation is described above. In class B operation, the quiescent current of $Q_{43}$ is also reduced. Since the quiescent current $I_{e42}$ is reduced, $V_{CNTL1}$ can be lowered accordingly. Thus, the second current source is not involved in class B operation, and the quiescent bias currents in $Q_{42}$ and $Q_{43}$ are adjusted also.

Another type of circuit operation uses $Q_{44}$ and $Q_{43}$ for RF amplification, instead of $Q_{42}$ and $Q_{43}$. Therefore, the first stage is a common emitter stage (for $Q_{44}$) instead of a common collector/emitter follower stage (for $Q_{42}$). $R_{43}$ will adjust the gain and the input impedance of the first common emitter stage in much the same way as $R_{32}$ in FIG. 3. Notice that there is no RF choke used in the RF amplifier/bias circuit configuration illustrated in FIG. 4, except for the output matching circuit block. Performance is quite comparable for both the FIG. 3 approach and the FIG. 4 approach.

The foregoing and subsequent descriptions enable one of ordinary skill in the art to implement the circuit in FIG. 4, using known components and design techniques, with either bipolar transistors or enhancement mode FETs. Thus, FIG. 4 is intended to illustrate both bipolar transistor and enhancement mode FET embodiments.

Figure 5:
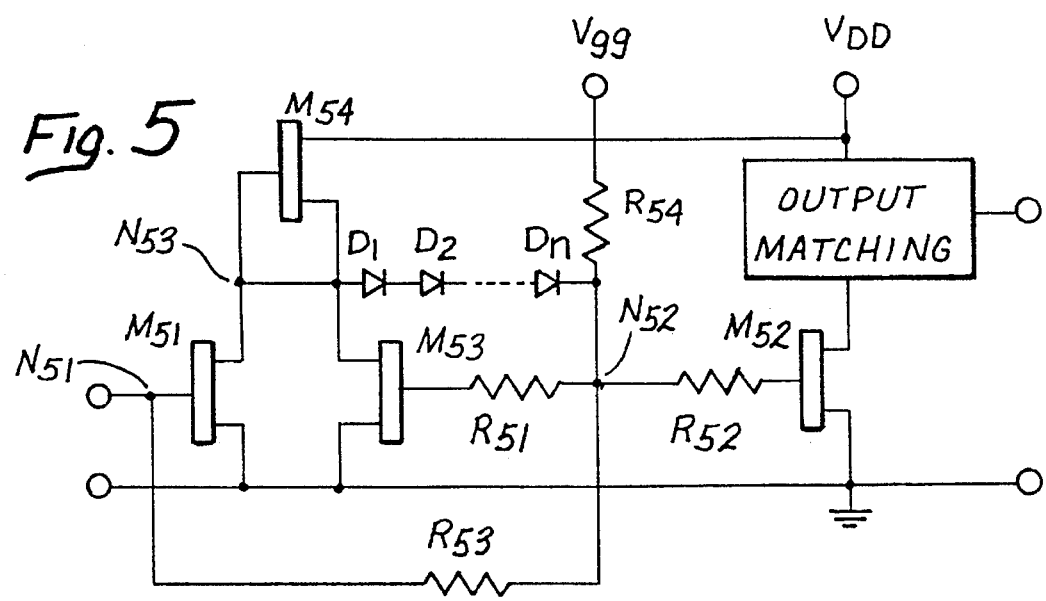
FIG. 5 is a schematic circuit diagram of a third RF amplifier constructed according to the invention using depletion mode FETs.

FIG. 5 illustrates a depletion mode FET embodiment. The foregoing description enables one of ordinary skill in the art to implement this RF amplifier circuit within the broader inventive concepts disclosed without further explanation. Notice, however, that diodes $D_1$ through $D_n$ are used to provide DC potential offset. With the gate of $M_{54}$ connected to the source, the $I_{DSS}$ of $M_{54}$ flows down through $M_{51}$ and $M_{53}$, while a small fraction flows through diodes $D_1$ through $D_n$ and $R_{54}$ to $V_{gg}$ (a negative voltage). The voltage at the node $N_{52}$ is set at approximately $-V_p/2$, and the voltage at the node $N_{53}$ is set at $V_K+V_p/2$. $R_{51}$, $R_{53}$, and $R_{54}$ are large in value compared with $1/(\omega C_{gs})$ of $M_{52}$.

The RF signal applied at the node $N_{51}$ causes drain current of $M_{51}$ to change accordingly. The RF drain current of $M_{51}$ flows through the diodes $D_1$ through $D_n$ to the node $N_{52}$. Since $M_{52}$ has the lowest impedance connected to the node $N_{52}$, a majority of the RF current flows into $M_{52}$, and is amplified by $M_{52}$ and the output matching circuit. The large $R_{51}$ isolates the $M_{53}$ from the RF circuit. $R_{53}$ provides DC gate voltage to $M_{51}$, but offers minimum feedback from the node $N_{52}$ to the input $N_{51}$. $R_{52}$ is used to adjust the gain of the amplifier.

Thus, the invention eliminates an external de-bias circuit. It simplifies interstage coupling. It enables implementation in a smaller package. And it may use bipolar transistors or either enhancement mode or depletion mode FETs to achieve two-stage amplification with fewer components and less size and cost. Although exemplary embodiments have been shown and described, one of ordinary skill in the art may make many changes, modifications, and substitutions without necessarily departing from the spirit and scope of the invention. For example, a variation of the circuit in FIG. 4 has $Q_{42}$ eliminated. Using the node $N_{43}$ as the input, $Q_{43}$ is biased in the two-transistor configuration, just like $Q_{44}$ and $Q_{45}$.

What is claimed is:

1. An amplifier circuit having an input terminal, an output terminal, a power supply terminal, and a control node, the amplifier circuit comprising:

means in the form of first, second, and third transistors interconnected in a modified current source configuration with first, second, and third resistors and a matching circuit for producing a desired bias current according to the magnitude of a control voltage coupled to the control node while producing an amplified output radio frequency signal at the output terminal from an input radio frequency signal coupled to the input terminal, each of the first, second, and third transistors having a base, an emitter, and a collector;

the first transistor having its collector connected to a first common node, its base connected to a second common node, and its emitter connected to a common ground;

the second transistor having its base connected to the first common node and its collector connected to the power supply terminal;

the third transistor having its base connected to the second common node and its emitter connected to the common ground;

the first resistor being connected between the first common node and the control node;

the second resistor being connected between the emitter of the second transistor and the second common node;

the third resistor being connected between the second common node and the common ground; and the matching circuit including means connected to the collector of the third transistor, the power supply terminal, and the output terminal for presenting a desired impedance between the collector of the third transistor and the power supply terminal while matching that impedance to the impedance of a lead connected to the output terminal.

2. A circuit as recited in claim 1, further comprising means in the form of a low pass network connected between the second common node and the second resistor for increasing the RF impedance without affecting DC bias.

3. A circuit as recited in claim 2, wherein the low pass network includes an inductor connected between the second common node and the second resistor and a capacitor connected between the common ground and node common to the inductor and the second resistor.

4. A circuit as recited in claim 1, further comprising means in the form of a capacitor connected between the first common node and the input terminal for blocking DC while presenting a low impedance RF path.

5. A circuit as recited in claim 1, further comprising means in the form of a current source connected between the second common node and the third resistor for setting the bias for a selected one of class A, class AB, and class B operation.

6. A circuit as recited in claim 5, wherein the current source includes:

fourth and fifth transistors and fourth and fifth resistors, each of the fourth and fifth transistors having a base, an emitter, and a collector;

the fourth transistor having its collector connected to the second common node, its emitter connected to the third resistor, and its base connected to a third common node;

the fifth transistor having its base and its collector connected to the third common node;

the fourth resistor being connected between the emitter of the fifth transistor and the common ground; and the fifth resistor being connected between the third common node and a second control node.

7. A circuit as recited in claim 6, wherein the input terminal is connected to the third common node.

8. A circuit as recited in claim 1, wherein the input terminal is connected to the first common node.

9. An amplifier circuit having an input terminal, an output terminal, a power supply terminal, and a control node, the amplifier circuit comprising:

means in the form of first, second, and third field effect transistors interconnected in a modified current source configuration with first, second, and third resistors and a matching circuit for producing a desired bias current according to the magnitude of a control voltage coupled to the control node while producing an amplified output radio frequency signal at the output terminal from an input radio frequency signal coupled to the input terminal, each of the first, second, and third field effect transistors having a gate, a source, and a drain;

the first transistor having its drain connected to a first common node, its gate connected to a second common node, and its source connected to a common ground;

the second transistor having its gate connected to the first common node and its drain connected to the power supply terminal;

the third transistor having its gate connected to the second common node and its source connected to the common ground;

the first resistor being connected between the first common node and the control node;

the second resistor being connected between the source of the second transistor and the second common node;

the third resistor being connected between the second common node and the common ground; and the matching circuit including means connected to the drain of the third transistor, the power supply terminal, and the output terminal for presenting a desired impedance between the drain of the third transistor and the power supply terminal and for matching that impedance to the impedance of a load connected to the output terminal.

10. A circuit as recited in claim 9, further comprising means in the form of a low pass network connected between the second common node and the second resistor for increasing RF impedance without affecting DC bias.

11. A circuit as recited in claim 10, wherein the low pass network includes an inductor connected between the second common node and the second resistor and a capacitor connected between the common ground and node common to the inductor and the second resistor.

12. A circuit as recited in claim 9, further comprising means in the form of a capacitor connected between the first common node and the input terminal for blocking DC while presenting a low impedance RF path.

13. A circuit as recited in claim 9, further comprising means in the form of a current source connected between the second common node and the third resistor for setting the bias for a selected one of class A, class AB, and class B operation.

14. A circuit as recited in claim 13, wherein the current source includes:

fourth and fifth field effect transistors and fourth and fifth resistors, each of the fourth and fifth transistors having a gate, a source, and a drain;

the fourth transistor having its drain connected to the second common node, its source connected to the third resistor, and its gate connected to a third common node;

the fifth transistor having its gate connected to the third common node and its drain connected to the third common node;

the fourth resistor connected between the source of the fifth transistor and the common ground; and the fifth resistor connected between the third common node and a second control node.

15. An amplifier circuit having an input terminal, an output terminal, a power supply terminal, and a control node, the amplifier circuit comprising:

means in the form of first, second, third, and fourth field effect transistors interconnected in a modified current source configuration with first, second, third, and fourth resistors, a diode combination, and a matching circuit for producing a desired bias current according to the magnitude of a control voltage coupled to the control node while producing an amplified output radio frequency signal at the output terminal from an input radio frequency signal coupled to the input terminal, each of the first, second, third, and fourth transistors having a gate, a source, and a drain;

the first transistor having its gate connected to a first common node, its source connected to a common ground, and its drain connected to a third common node;

the second transistor having its source connected to the common ground;

the third transistor having its source connected to the common ground and its drain connected to the third common node;

the fourth transistor having both its gate and its source connected to the third common node and its drain connected to the power supply terminal;

the first resistor being connected between the second common node and the gate of the first transistor;

the second resistor being connected between the second common node and the gate of the second transistor;

the third resistor being connected between the second common node and the gate of the first transistor;

the fourth resistor being connected between the second common node and the control node; and the diode combination being connected between the second common node the third common node.

* * * * *